United States Patent [19]

Gay

[11] Patent Number: 4,763,024
[45] Date of Patent: Aug. 9, 1988

[54] GAIN CONTROL CELL

[75] Inventor: Michael J. Gay, Coppet, Switzerland

[73] Assignee: Motorola, Inc., Schaumburg, Ill.

[21] Appl. No.: 73,236

[22] Filed: Jul. 14, 1987

[30] Foreign Application Priority Data

Sep. 17, 1986 [GB] United Kingdom ............... 8622440

[51] Int. Cl.[4] ................... G06G 7/12; H03F 3/45
[52] U.S. Cl. .................. 307/493; 330/254; 330/257; 330/288
[58] Field of Search ............. 307/264, 355, 362, 493; 330/254, 257, 278, 288, 310, 311

[56] References Cited

U.S. PATENT DOCUMENTS

| 3,761,741 | 9/1973 | Hoeft ................................ 307/567 |
| 4,288,707 | 9/1981 | Katakura ........................... 307/264 |
| 4,459,555 | 7/1984 | Jett, Jr. ............................ 330/254 X |
| 4,568,840 | 2/1986 | Kenji ................................ 330/288 X |

Primary Examiner—Eugene R. LaRoche
Assistant Examiner—Steven J. Mottola
Attorney, Agent, or Firm—Michael D. Bingham

[57] ABSTRACT

A gain control cell comprises an input stage (10) having first (12) and second (13) input nodes and including a first current mirror ($T_{14}$), and an output stage (11) having an output node (14) and including a second current mirror ($T_{15}$). The input stage (10) is biased by a first current source $I_{11}$ and the output stage (11) is biased by a second current source $I_{12}$, the gain of the cell being defined by the ratio of the two current sources. The two current mirrors are matched so that errors due to the finite current gains of the current mirrors compensate for each other. The quiescent output current is thus substantially independent of the current gains of the pnp transistors used in the current mirrors.

3 Claims, 1 Drawing Sheet

GAIN CONTROL CELL

BACKGROUND OF THE INVENTION

This invention relates to gain control cells for adjusting the gains of signle paths.

A number of different arrangements have hitherto been proposed for adjusting the gains of signal paths in analogue IC systems. One well known circuit uses a balanced multiplier arrangement having two pairs of emitter-coupled transistors coupled so as to eliminate variations in the quiescent output voltage. This arrangement, however, provides a low output impedance and no rejection of supply line signals. Consequently other arrangements are often preferred.

In one solution, the bias and signal currents passing through one of the multipliers are inverted by a current mirror and added to the bias current passing through the other multiplier so that the bias currents cancel and a high impedance output is provided.

The known arrangements described above suffer from several disadvantages, notably complexity of biassing arrangements and sensitivity to the gain of the pnp transistors used in the current mirror. In general, pnp transistors in IC technology are of relatively poor performance. However, it is not normally desirable to invert the structures described to eliminate the pnp current mirror problem since the base-emitter voltage/collector current characteristics of npn transistors are less ideal than those of the pnp transistors. The pnp devices must therefore be used for the current mirror where its low gain causes dc offsets and gain errors.

SUMMARY OF THE INVENTION

It is thus an object of the present invention to provide a gain control cell which requires much less complex biassing than known arrangements and which is substantially insensitive to the current gain of current mirrors.

Accordingly, the invention provides a gain control cell comprising an input stage having first and second input nodes and including a first current mirror, an output stage having an output node and including a second current mirror substantially matched to said first current mirror, and first and second current sources coupled to bias said input and output stages respectively, wherein the gain of the cell is defined by the ratio of said two current sources and is substantially independent of the current gains of the current mirrors.

BRIEF DESCRIPTION OF THE DRAWINGS

The invention will now be more fully described by way of example with reference to the drawings of which.

DESCRIPTION OF THE INVENTION

Figure 1:
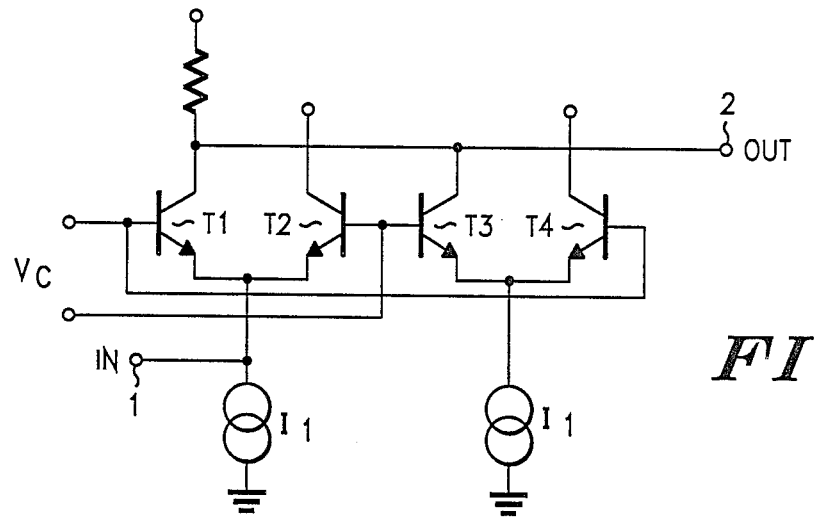
FIG. 1 shows a known balanced multiplier arrangement.

Thus, in the balanced multiplier arrangement shown in FIG. 1, an input current is supplied to input node 1. This input current is divided between the emitters of transistor $T_1$ and $T_2$ in response to a control voltage Vc applied between the bases thereof. Transistors $T_1$ and $T_2$ are biassed by current generator $I_1$ and, in order to eliminate variations in the quiescent output voltage, a second pair of transistors $T_3$ and $T_4$ receiving the same control voltage Vc as transistors $T_1$ and $T_2$ and biassed at the same current level is added, the bases of transistors $T_2$ and $T_3$ being coupled together, the bases of transistors $T_1$ and $T_4$ being coupled together and the transistors of $T_1$ and $T_3$ being coupled together. An output signal is then provided at node 2 from the collectors of transistors $T_1$ and $T_3$. This arrangement provides only a low impedance and provides no rejection of supply line signals, as mentioned above.

Figure 2:
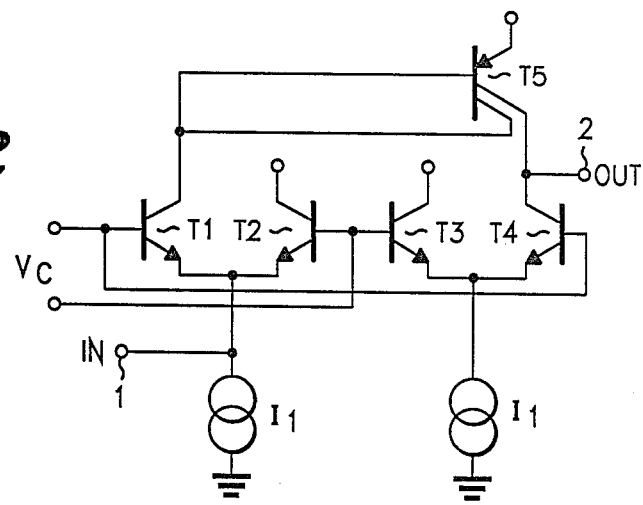
FIG. 2 shows a known variation of the balanced multiplier arrangement of FIG. 1.

In a variation of this arrangement, it is known to invert the current (bias and signal) flowing in transistor $T_1$ by a well known current mirror arrangement provided by transistor $T_5$, as shown in FIG. 2. The inverted current is then added to the bias current flowing in transistor $T_4$ which matches transistor $T_1$. The bias currents at the output node 2 thus nominally cancel and the circuit provides an output signal current i.e. has a high impedance output.

Often, to provide a well defined gain control, the control voltage is developed by feeding known currents ($I_2$ and $I_3$) into a pair of diodes or equivalent. It is well known that the control voltage (Vc) is then given by $$Vc = \frac{kT}{q} \ln \frac{I_2}{I_3}$$

and that the currents in transistors $T_1$ and $T_2$ in the arrangements shown in FIGS. 1 and 2 can be divided in the ratio $I_2/I_3$ in response to this voltage.

Figure 3:
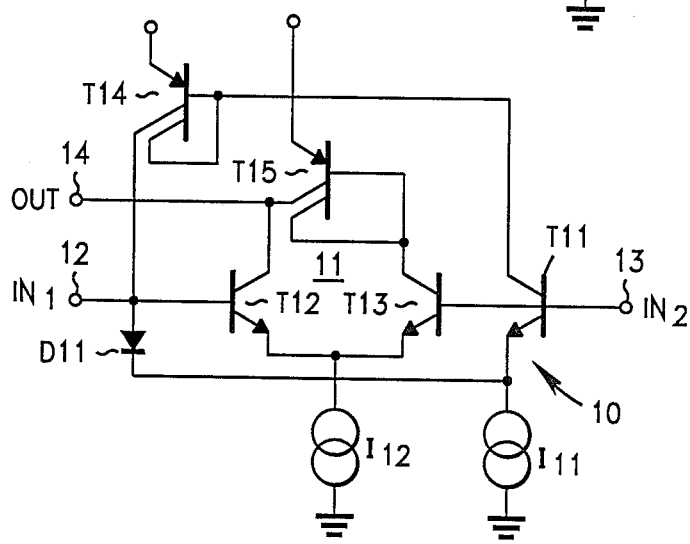
FIG. 3 shows a gain control cell according to the invention.

However the known arrangements described above suffer from several disadvantages as discussed earlier and consequently it is an object of the present invention shown in FIG. 3 to overcome or at least alleviate some of these disadvantages.

Thus according to the invention, the gain control cell shown in FIG. 3 consists of an input stage 10 and an output stage 11. The input stage 10 comprises a diode $D_{11}$, a transistor $T_{11}$ and a current mirror formed by a transistor $T_{14}$, and is biassed by a current source $I_{11}$. The output stage 11 comprises emitter-coupled transistors $T_{12}$ and $T_{13}$ and a current mirror formed by a transistor $T_{15}$, and is biassed by current source $I_{12}$.

Diode $D_{11}$ has its cathode coupled to the emitter of transistor $T_{11}$ and its anode coupled to a first input node 12 and to the output of current mirror $T_{14}$, the transistor $T_{11}$ having its collector coupled to the current mirror $T_{14}$, its emitter coupled to the current source $I_{11}$ and its base coupled to a second input node 13. Transistors $T_{12}$ and $T_{13}$ have their emitters coupled to the second current source $I_{12}$ and their bases coupled to input nodes 12 and 13 respectively. The second current mirror $T_{15}$ is coupled between the collectors of transistors $T_{12}$ and $T_{13}$, the collector of $T_{13}$ being coupled to the input of the second current mirror and an output node 14 is provided between the second current mirror and the collector of transistor $T_{12}$.

The bias current flowing in transistor $T_{11}$ is mirrored by current mirror $T_{14}$ and fed through diode $D_{11}$. The current $I_{11}$ is thus divided into substantially equal parts flowing in transistor $T_{11}$ and diode $D_{11}$. The differential voltage developed between the input nodes 12 and 13 is thus near zero and the current $I_{12}$ thus divides substantially equally between transistors $T_{12}$ and $T_{13}$. The current through transistor $T_{13}$ is mirrored by current mirror $T_{15}$ and is subtracted from that in transistor $T_{12}$ at the output node 14 so that the quiescent output current is nominally zero.

The errors which are introduced in the division of current $I_{11}$ between diode $D_{11}$ and transistor $T_{11}$ due to the finite current gain of current mirror $T_{14}$ generate an offset voltage such that the current in transistor $T_{13}$ exceeds that in transistor $T_{12}$ by the factor necessary to compensate for the errors due to the finite current gain of the current mirror $T_{15}$, provided that transistors $T_{14}$ and $T_{15}$ are matched. The quiescent output current is thus substantially independent of the current gains of the pnp transistors used in the current mirrors.

The input signal may be a current supplied to input node 12 in which case input node 13 is coupled to a suitable bias voltage or may be a voltage applied to input node 13 in which case input node 12 is coupled via a resistor to a bias voltage, normally equal to the quiescent level at input node 13. In the second case the signal current flowing in the input circuit will usually be substantially defined by the resistor.

To simplify the discussion consider the case where the input signal is a current supplied to input node 12. The part of this current which flows through the input stage 10 is mirrored by transistor stage $T_{14}$ the output current of which is also drawn from the input node 12. Thus, apparently half the signal current flows through the input stage 10. The signal current flowing through the input stage produces a signal voltage which, applied to transistor pair $T_{12}$ and $T_{13}$ causes a signal current to flow therein having an amplitude related to that flowing in the input stage 10 by the ratio of the bias currents $I_{12}/I_{11}$. The signal current flowing through transistor $T_{13}$ is inverted by the current mirror $T_{15}$ and added to that flowing in transistor $T_{12}$ so the output current is approximately twice that flowing through transistor pair $T_{12}$ and $T_{13}$. The fraction of the input current flowing through input stage 10 will be increased above one half due to the finite current gain of current mirror $T_{14}$ and the corresponding increase in the current flowing in transistors $T_{12}$ and $T_{13}$ compensates exactly for the loss of output signal due to the finite current gain of current mirror $T_{15}$, assuming the gains of current mirrors $T_{14}$ and $T_{15}$ to be matched. The gain of the circuit is thus $I_{12}/I_{11}$ and is substantially independent of the current gains of the pnp transistors $T_{14}$ and $T_{15}$.

It should be noted that the current mirror $T_{15}$ may be connected in opposited phase to that shown.

In this case the circuit provides an output current of opposite phase to that in the case discussed above. The gain remains substantially independent of the pnp current gains but a dc offset dependent thereon is now produced. This arrangement is thus a less preferred version.

It will be noted that the biassing of the circuit can be extremely simple: in the case of current input it suffices to correct input node 13 to a suitable voltage source, which can be relatively high impedance since only the base current of transistor $T_{11}$ must be supplied therefrom.

Thus, what has been described is a gain control cell having a current driven and a voltage driven input terminals and a current output having a gain defined by the ratio of the two current sources, the gain being substantially independent of the current gains of the transistors used in the current mirrors, the current gains not engendering any substantial offset output current provided only that they be matched.

I claim:

1. A gain control cell comprising an input stage having first and second input nodes and including a first current mirror, an output stage having first and second inputs coupled to said first and second input nodes respectively and an output node and including a second current mirror substantially matched to said first current mirror, and first and second current sources coupled to bias said input and output stages respectively, wherein the gain of the cell is defined by the ratio of said two current sources and is substantially independent of the current gains of said two current mirrors.

2. The gain control cell of claim 1 wherein said input stage includes:
    a first transistor having a base, collector and an emitter, said base being coupled to said second input node, said collector being coupled to an input of said first current mirror, said emitter being coupled to said first current source; and
    diode means having first and second electrodes, said first electrode being coupled both to said first input node and an output of said first current mirror, said second electrode being coupled to said emitter of said first transistor.

3. The gain control cell of claim 2 wherein said output stage includes:
    second and third transistors each having a base, collector and an emitter, said base of said first transistor being coupled to said first input node, said emitter being coupled both to said emitter of said third transistor and to said second current source, said base of said third transistor being coupled to said second input node; and
    said second current mirror having an input and an output coupled respectively to said collectors of said third transistor and said second transistor, said output of said second current mirror also being coupled to said output node of said output stage.

* * * * *